United States Patent [19]

Sparks

[11] Patent Number: 5,250,461
[45] Date of Patent: Oct. 5, 1993

[54] METHOD FOR DIELECTRICALLY ISOLATING INTEGRATED CIRCUITS USING DOPED OXIDE SIDEWALLS

[75] Inventor: Douglas R. Sparks, Kokomo, Ind.

[73] Assignee: Delco Electronics Corporation, Kokomo, Ind.

[21] Appl. No.: 871,147

[22] Filed: Apr. 20, 1992

Related U.S. Application Data

[62] Division of Ser. No. 701,896, May 17, 1991, abandoned.

[51] Int. Cl.$^5$ ............................................. H01C 21/76
[52] U.S. Cl. ..................................... 437/67; 437/90; 437/164; 148/DIG. 20
[58] Field of Search ............... 148/DIG. 85, DIG. 86, 148/DIG. 50, DIG. 20, DIG. 37; 437/67, 90, 164

[56] References Cited

U.S. PATENT DOCUMENTS

| | | | |
|---|---|---|---|
| 4,001,050 | 1/1977 | Koo | 357/91 |
| 4,589,190 | 5/1986 | Anthony | 357/20 |
| 4,593,458 | 6/1986 | Adler | 29/576 W |
| 4,745,081 | 5/1988 | Beyer et al. | 437/90 |
| 4,763,179 | 8/1988 | Tsubouchi et al. | 357/23.7 |
| 4,878,957 | 11/1989 | Yamaguchi et al. | 357/60 |
| 4,937,648 | 6/1990 | Huang | 357/119 |
| 4,992,843 | 2/1991 | Blossfeld et al. | 357/49 |

FOREIGN PATENT DOCUMENTS

58-19781  11/1983  Japan .
58-192346 11/1983  Japan .

OTHER PUBLICATIONS

N. Endo et al., "Selective Epitaxial Technology for Scaled CMOS", Proceedings of the First International Symposium on Ultra Large Scale Integration Science and Technology, ULSI Science and Technology/1987, Proceedings vol. 87-11, pp. 64-72, published by Electrochemical Society, Inc., 10 So. Main St., Pennengton, NJ 08534-2896.

*Primary Examiner*—George Fourson
*Attorney, Agent, or Firm*—Robert J. Wallace

[57] ABSTRACT

A method for dielectrically isolating a semiconductor integrated circuit is provided. Each integrated circuit is substantially surrounded by silicon oxide sidewalls which have been appropriately doped to be of an opposite conductivity type as the surrounding substrate. The doped silicon oxide sidewalls are formed prior to the growth of epitaxial silicon within the sidewalls. Upon deposition of the epitaxial silicon the dopant within the oxide sidewalls diffuses into the adjacent epitaxial silicon, thereby resulting in a heavily doped, low resistivity region of epitaxial silicon adjacent to and along the entire length of the oxide sidewall. This heavily doped region results in the substantial elimination of charge-depleting parasitic currents along the sidewalls during use of the integrated circuit. In addition, the heavily doped, low resistivity epitaxial region provides an electrically conductive contact to a buried layer within an integrated circuit having such a buried layer. Extremely thin and long, contacts can be made to the buried layer using this method, without the traditional need for long diffusion times which result in excessively wide diffusion zones.

17 Claims, 2 Drawing Sheets

METHOD FOR DIELECTRICALLY ISOLATING INTEGRATED CIRCUITS USING DOPED OXIDE SIDEWALLS

"This is a division of application Ser. No. 07/701896 filed on May 17, 1991, now abandoned.

This invention generally relates to methods for dielectrically isolating individual semiconductor integrated circuit devices. More particularly, this invention relates to such a method wherein each semiconductor device is dielectrically isolated by means of silicon oxide sidewalls which have been heavily doped; such that the dopant diffuses out of the oxide sidewalls and into the subsequently grown epitaxial silicon thereby forming a heavily doped, low resistivity, epitaxial silicon region which prevents the formation of charge-depleting parasitic currents along the oxide sidewalls while concurrently providing a low resistivity, electrical contact to an electrically conductive buried layer within the integrated circuit.

BACKGROUND OF THE INVENTION

Semiconductor integrated circuits are universally used in microelectronic devices because of their seemingly endless potential for differing applications coupled with their miniature size. Examples of widely used types of integrated circuits are bipolar transistors, complementary metal oxide semiconductors (CMOS), double diffused metal oxide semiconductors (DMOS) and bipolar complementary metal oxide semiconductors (BICMOS), as well as many other types of devices. It is not unusual for there to be thousands of individual integrated circuits provided on a single substrate for a particular application.

However, in order to ensure proper functioning of the individual integrated circuits and the entire package as a whole, the various semiconductor integrated circuits must be electrically isolated from each other. The electrical isolation is necessary so as to prevent formation of parasitic device-to-device electrical currents and/or parasitic device-to-substrate electrical currents between the integrated circuits. These parasitic currents are detrimental in that they degrade the electrical charge-transporting capabilities of the affected integrated circuit.

In order to achieve this device isolation, it is common practice to surround the individual integrated circuits with a dielectric material, such as silicon oxide, which prevents conduction of electrical current through the material. Generally, a silicon oxide sidewall is formed around each of the integrated circuits. The silicon oxide, which is electrically non-conductive, surrounds the doped, electrically conductive, epitaxial silicon region containing the charge-carrying components of the device. The silicon oxide sidewalls prevent electrical current from passing between the isolated integrated circuits. However, there are several shortcomings associated with the use of this method of dielectric isolation. Because the epitaxial silicon regions are generally heavily doped and therefore electrically conductive, an electrically conductive channel is formed along the undoped oxide sidewalls when electrical charges are passed within the epitaxial region. This electrically conductive channel is parasitic in that it depletes the integrated circuit of usable electrical current and thereby diminishes its full charge carrying ability. Because of the formation of this parasitic channel, the efficiency of the integrated circuit is lowered and the maximum voltage which can be used is detrimentally limited.

Therefore it would be desirable to provide a method for dielectrically isolating individual semiconductor integrated circuits, which does not result in the formation of parasitic charge-depleting effects that consequently hamper the operability of the integrated circuit.

In addition, it would also be desirable if this method for dielectrically isolating the integrated circuits simultaneously resolved another shortcoming associated with the formation of these types of integrated circuits. Generally, the semiconductor integrated circuit contains an electrically conductive buried layer within the epitaxial silicon. Accordingly a low resistivity electrical contact is required to make contact to this buried layer. In order to form this electrical contact, a long diffusion period is typically required to traverse the entire thickness of epitaxial silicon (to the buried layer) with the dopant material, so as to ensure that the entire contact is appropriately doped to be of a higher electrical conductivity.

However, as dopant diffusion is occurring vertically through the material for formation of the contact to the buried layer, diffusion is also occurring laterally. Therefore, during a long diffusion period, such as that required for formation of the contact to the buried layer, there is a significant amount of unwanted lateral diffusion also. In practice, the thicker the epitaxial silicon layer which must be traversed by the contact in order to reach the buried layer, the wider the diffusion zone surrounding the contact to the buried layer will be. This results in diffusion zones around the electrical contacts of undesirably large widths, which accordingly consume excessively large amounts of area within the semiconductor material. This is particularly problematic, since the trend in microelectronics design is to constantly reduce the size of all of the integrated circuit components while concurrently enhancing their potential.

It would therefore be desirable to provide a method for forming these contacts to the buried layer within an integrated circuit which does not result in unnecessary lateral diffusion of the dopant material and which correspondingly permits narrower contacts. Further, it would be most desirable if such a method for forming these contacts were integral with the process for providing dielectric isolation between individual semiconductor devices, wherein the process for forming dielectric isolation avoids the shortcomings of the prior art, particularly the formation of parasitic charge-depleting effects.

SUMMARY OF THE INVENTION

It is an object of the present invention to provide a method for forming the dielectric isolation between semiconductor integrated circuit devices.

It is a further object of this invention that such a dielectric isolation method utilize doped silicon oxide sidewalls which surround the integrated circuit device and which result in the substantial elimination of parasitic charge-depleting effects along these sidewalls during operation of the integrated circuit.

It is still a further object of this invention that the doped silicon oxide sidewalls of this invention be also useful for providing a low resistivity, electrical contact to an electrically conductive buried layer within the integrated circuit.

In accordance with a preferred embodiment of this invention, these and other objects and advantages are accomplished as follows.

A method for dielectrically isolating a semiconductor integrated circuit is provided. Each integrated circuit is substantially surrounded by silicon oxide sidewalls which have been appropriately doped to N- type conductivity. The N-type silicon oxide sidewalls are formed prior to the growth of epitaxial silicon within the sidewalls. Upon the subsequent growth of the epitaxial silicon, the dopant within the silicon oxide sidewalls concurrently diffuses into the adjacent epitaxial silicon region, thereby forming a heavily doped, epitaxial silicon diffusion region adjacent to the oxide sidewall. The heavily doped epitaxial silicon region results in the substantial elimination of charge-depleting parasitic currents along the sidewalls during operation of the integrated circuit.

Also, if desired, the doped silicon oxide sidewall may be used to form an electrically conductive, low resistivity contact to a buried layer within an integrated circuit having such a buried layer. As previously described, during the growth of the epitaxial silicon the dopant within the oxide sidewalls diffuses into the adjacent region of epitaxial silicon, thereby forming a heavily doped epitaxial region adjacent to the oxide sidewalls which runs the length of the sidewalls to the buried layer. Therefore, the long diffusion periods which are normally required for forming a contact to a buried layer are eliminated since the dopant does not have to traverse the entire epitaxial silicon layer, but rather merely diffuse through the relatively thin doped silicon oxide sidewall into the adjacent epitaxial silicon. These electrical contacts can therefore be made to contact the buried layer which have extremely narrow geometries.

Preferably, this method of dielectric isolation is achieved generally as follows. First, a layer of silicon oxide is deposited onto a single crystal, silicon substrate which is preferably oriented along the [100] or [111] crystallographic planes and doped to be P-type electrically conductive. The layer of silicon oxide is patterned so as to expose those regions of the underlying substrate wherein the integrated circuits will be formed. These exposed regions of the silicon substrate are then etched so as to form trenches within the substrate. The exposed surfaces of the trench, i.e., the sidewalls and bottom surface, are doped so as to be characterized by P+ conductivity.

A second layer of silicon oxide is then deposited onto these doped surfaces of the trench. This second oxide layer is also doped appropriately, preferably N+ conductivity type with the preferred P-type silicon substrate. Next the portion of this doped silicon oxide layer and the P+ doped region of the substrate, which is on the bottom surface of the silicon trench, are etched, such as by reactive ion etching techniques, so as to again expose the underlying virgin silicon substrate. This results in the presence of N+ doped silicon oxide sidewalls around the silicon trench. Epitaxial silicon is then grown from the exposed underlying silicon substrate at the bottom surface of the trench. During the deposition of this epitaxial silicon, the N+ dopant within the adjacent oxide sidewalls diffuses into the epitaxial silicon, resulting in a heavily doped region of epitaxial silicon adjacent to the oxide sidewall. Lastly, conventional processing techniques are used to achieve the particular type of integrated circuit device. The doped silicon oxide sidewalls enable the dielectrical isolation of the integrated circuit device.

It is foreseeable prior to the growth of epitaxial silicon from the bottom surface of the trench, that an electrically conductive layer (i.e., the buried layer) would be formed within the silicon substrate and adjacent to this bottom surface of this trench. This layer is formed by diffusing the appropriate dopant into that region and would later become the electrically conductive buried layer within the integrated circuit after growth of the epitaxial silicon. With the preferred P-type conductivity for the silicon substrate, the buried layer would be doped to be of an N+ conductivity type.

The doped silicon oxide sidewall of this invention enables the formation of an electrical contact to this buried layer yet avoids the shortcomings of the prior art. Since the doped sidewall is formed prior to the growth of the epitaxial silicon within the trench, the dopants diffuse into the adjacent epitaxial silicon during deposition of the epitaxial silicon. Therefore, a heavily doped region of epitaxial silicon is formed adjacent to the entire length of the oxide sidewall (to the buried layer), which provides the required electrical contact to the buried layer. This contact is formed without the need for diffusing dopant through the entire thickness of the epitaxial silicon layer. Accordingly, the diffusion period is minimized.

The method of this invention, wherein an integrated circuit is dielectrically isolated by means of first surrounding the semiconductor device with doped silicon oxide sidewalls which diffuse into and heavily dope the adjacent epitaxial silicon, is particularly advantageous and inventive as compared to the conventional techniques for accomplishing such isolation. Because the epitaxial silicon is doped to be of an opposite conductivity type as the surrounding substrate, this prevents the formation of parasitic charge-depleting effects along the sidewalls during use of the integrated circuit.

Also, since the sidewalls are doped prior to the growth of the epitaxial silicon within the sidewalls, the dopant within the sidewalls diffuses into an adjacent region of the epitaxial silicon, thereby forming a low resistivity path or contact to a buried layer within the integrated circuit. Since long diffusion periods are not required to form this buried layer contact, extremely small geometry devices can be made. It is believed that submicron wide contacts to the buried layer may be formed. Also, any defects which may exist at the interface between the silicon oxide and epitaxial silicon become electrically inactive because the diffusion zone within the epitaxial silicon is sufficiently wide so as to avoid these defects.

Other objects and advantages of this invention will be better appreciated from the detailed description thereof, which follows.

BRIEF DESCRIPTION OF THE DRAWINGS

The above and other advantages of this invention will become more apparent from the following description taken in conjunction with the accompanying drawing wherein.

DETAILED DESCRIPTION OF THE PREFERRED EMBODIMENTS

In accordance with this invention, a method for forming the dielectric isolation around an integrated circuit is provided and is accomplished using a doped silicon oxide sidewall which surrounds the integrated circuit. Each integrated circuit is substantially surrounded by silicon oxide sidewalls which have been appropriately doped to be of an opposite conductivity type as compared to the surrounding substrate. The dielectric isolation method of this invention substantially eliminates the formation of any charge-depleting parasitic effects during use of the integrated circuit.

The doped silicon oxide sidewalls are formed prior to the growth of epitaxial silicon within the sidewalls. In addition, since the doped sidewalls are formed prior to the growth of the epitaxial silicon within the sidewalls, during that growth of the epitaxial silicon a portion of the dopant diffuses through the oxide sidewall into the adjacent region of the epitaxial silicon forming a heavily doped, extremely narrow, yet long, low resistivity path (or plug) to the buried layer.

The method of dielectric isolation of this invention is preferably achieved as follows.

Figure 1:
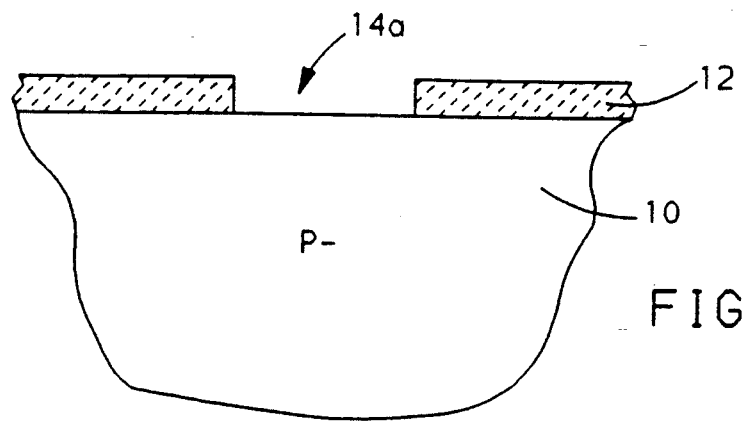
FIGS. 1 through 7 are cross-sectional views of the sequential processing steps used to form the doped silicon oxide sidewalls in accordance with the method of this invention.

As shown in FIG. 1, a single crystal, silicon substrate 10 is provided. Preferably the silicon substrate 10 is oriented along the [100] crystallographic plane and characterized by P-type electrical conductivity. Although suitable results are also obtained when the silicon substrate 10 is oriented along the [111] crystallographic plane and characterized by P- type electrical conductivity, since crystallographic orientation of the single crystal substrate 10 does not appear to be critical to the teachings of this invention. A first layer 12 of silicon oxide is conventionally deposited onto the silicon substrate 10. Preferably, the silicon oxide layer 12 is thermally grown or deposited using standard techniques to a thickness of about 8000 Angstroms which is a typical thickness for an oxide mask layer 12. It is foreseeable, however, that the thickness of this first silicon oxide layer 12 could range between about 5000 Angstroms and about 10,000 Angstroms without detrimental effects.

As FIG. 1 illustrates, this first layer 12 of silicon oxide is conventionally patterned so as to expose at least one predetermined region 14a of the underlying single crystal silicon substrate 10. Most probably, the silicon oxide layer 12 is patterned using standard photolithographic techniques. The predetermined region 14a of the silicon substrate 10 is the location for subsequent formation of an integrated circuit.

Figure 2:
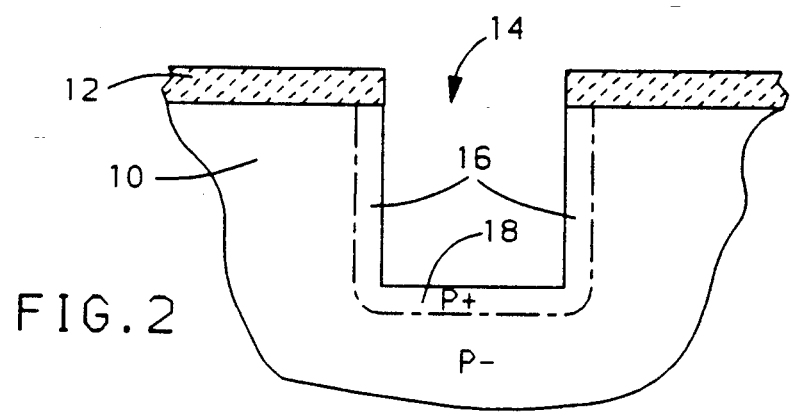

Next, as shown in FIG. 2, the exposed region 14a of the silicon substrate 10 is conventionally etched, so as to form a trench 14 within the single crystal substrate 10. A single silicon substrate 10 was etched having a width of about five micrometers and a depth of about three to four micrometers using a Tegal 701 plasma etcher operating at about 100 watts for a sufficient duration, and utilizing Freon 11 as the etchant medium, other plasma etchers or etching techniques could also be used, such as conventional wet etching techniques using a hydrofluoric acid of sufficient strength, which preferentially attacks the single crystal silicon substrate 10 and not the silicon oxide layer 12. The trench 14 may vary in width and depth depending upon the desired application. Generally, it is preferred to keep the width and depth dimensions of the trench 14 between about three and about twenty micrometers, since less than about three micrometers will result in undue electrical influence between components and greater than about twenty micrometers will cause difficulties in the processing of the components. A typical depth of about five micrometers would be appropriate for this type of device.

The sidewalls 16 and bottom surface 18 of the trench 14 are then doped to be P+ conductivity type characterized by a dopant level of about $10^{17}$ atoms per centimeters$^3$ (atoms/cm$^3$), although this P+ doping is optional as described later. The P+ doping is preferably accomplished by immersing the substrate 10 in a gaseous boron source for a sufficient duration. The boron diffuses into the exposed silicon at the sidewalls 16 and bottom surface 18 of the trench 14 within the silicon substrate 10, but is substantially prevented from doing so in the silicon oxide layer 12. Preferably, the diffusion zone around the sidewalls 16 and bottom surface 18 will extend about 0.5 micrometers, with a range of about 0.1 micrometers to about two micrometers being acceptable. It is important that sufficient diffusion occur to effect the desired electrical characteristics within the material, without adversely affecting too much of the surrounding material. This boron doped diffusion zone 16 and 18 is preferred so as to suppress subsequent formation of N-type MOS effects along the oxide sidewalls 16, although as stated previously is not absolutely necessary.

Figure 3:
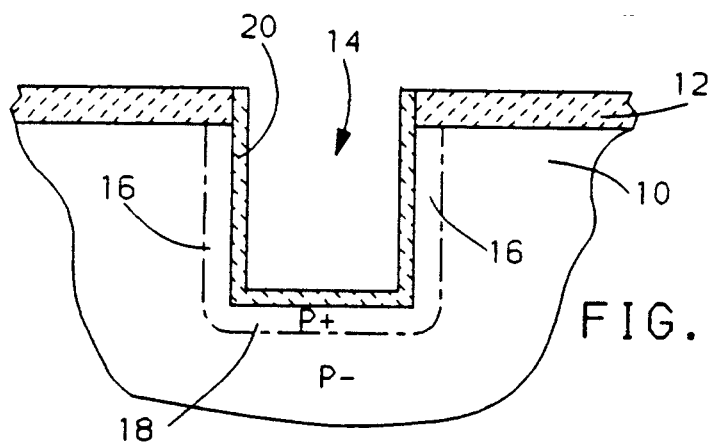

A second undoped silicon oxide layer 20 is then grown using conventional techniques from the exposed silicon material at the sidewalls 16 and bottom surface 18 of the trench 14, as shown in FIG. 3. This undoped silicon oxide layer 20 is grown to a desired thickness of about 5000 Angstroms on the sidewalls 16 and bottom surface 18 of the trench 14, with a range of about 1000 Angstroms to about 10,000 Angstroms being acceptable. The thickness of this oxide layer 20 must be sufficient to achieve the desired dielectric properties, since this oxide layer 20 will subsequently form part of the doped oxide sidewalls of this invention, but without adversely affecting the dimensions or electrical characteristics of the other components within the integrated circuit. This undoped oxide layer 20 also blocks dopant diffusion through the oxide sidewalls 16. A deposited silicon nitride could also be employed here, most probably, this oxide layer 20 is also thermally grown using conventional methods like the first oxide layer 12 which is upon the silicon substrate 10. In practice, silicon oxide may also grow from the first layer of silicon oxide 12 during this step, however, this additional growth to the first oxide layer 12 does not detrimentally affect the outcome of this invention, and may be advantageous since subsequent processing steps will result in the removal of some of this layer.

It is to be noted that an alternative embodiment would avoid the formation of the trench 14 within the silicon substrate 10. In this alternative embodiment, the material surrounding the sidewalls 16 of the trench 14 would not be the silicon substrate 10, but rather a silicon oxide layer. This would be accomplished as follows. The first silicon oxide layer 12 would be deposited onto the silicon substrate 10 to a much greater thickness than as shown. (Generally the thickness of the first oxide layer 12 would roughly equal the depth of the trench 14.) The first oxide layer 12 would then be patterned and etched so as to expose the underlying silicon substrate 10. The second layer of oxide 20 which is currently deposited onto the sidewalls 16 and bottom surface 18 of the trench 14 would instead be deposited onto the sidewalls of the first oxide layer 12 and surface of the exposed underlying silicon substrate 10. Processing would continue the same for both embodiments. This alternative embodiment may be useful if the formation of the silicon trench is to be avoided, such as most often used in selective epitaxial regrowth processes.

Figure 4:
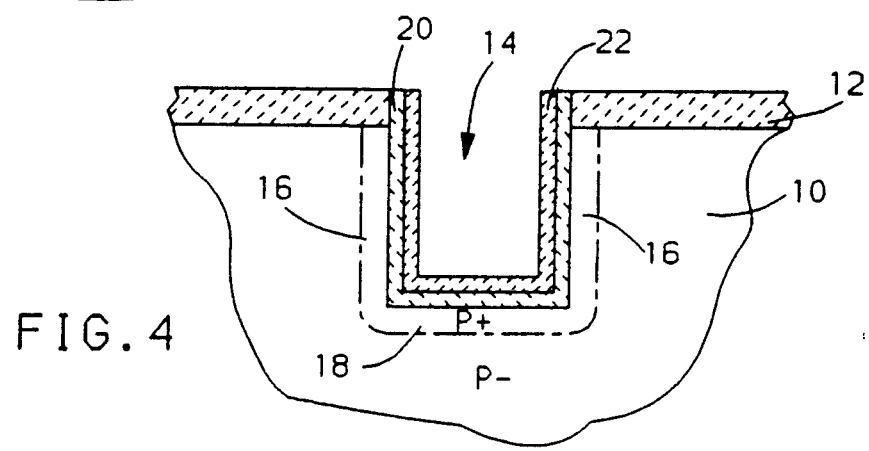

Next, as shown in FIG. 4, a doped, N+ conductivity type silicon oxide layer 22 is deposited onto the second oxide layer 20 along the sidewalls 16 and bottom surface 18 of the trench 14. This doped silicon oxide layer 22 is formed by depositing appropriately doped oxide from a doped gaseous source, again most probably by conventional thermal deposition techniques. Appropriate dopants for achieving an N+ conductivity type would be those with five valence electrons, such as phosphorus, arsenic or antimony. A suitable doped gaseous source would include one of these dopants, such as $POCl_3$ or phosphine, and is within the scope of conventional teachings. This doped silicon oxide layer 22 characterized by a dopant level of at least about $5 \times 10^{18}$ atoms/cm$^3$, since this is at least the dopant level desired for the subsequently formed, heavily doped, diffusion region of epitaxial silicon. As described later the dopant from this doped silicon oxide layer 22 diffuses into the epitaxial silicon during growth of that material, forming a heavily doped, low resistivity silicon oxide region. The thickness of this doped oxide layer 22 will range between about 500 Angstroms and about 5000 Angstroms, with about 2000 Angstroms being most typical of such doping processes. It is this doped oxide layer 22 around the sidewalls 16 of the trench 14, which will provide the dielectric isolation of the integrated circuit. Depending upon the thickness of the doped oxide layer 22 and the desired application, the first oxide layer 20 may or may not be necessary.

Figure 5:
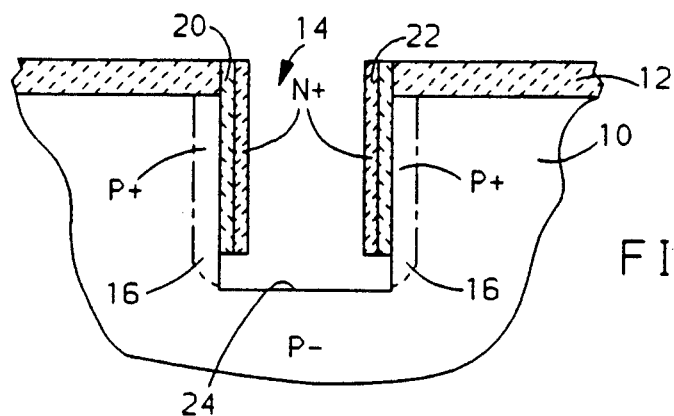

Then as shown in FIG. 5, the oxide layers 20 and 22, as well as the P+ conductivity type diffusion zone, on the bottom surface 18 of the trench 14 (as shown in FIGS. 2 through 4) are removed to again expose virgin silicon substrate 10 at the new bottom surface 24 of the trench 14. This is preferably accomplished using reactive ion etching techniques for a duration sufficient to remove both oxide layers 20 and 22 and the P+ diffusion zone of silicon from this bottom surface 18, with little or no removal of the underlying virgin silicon substrate 10. Reactive ion etching techniques are preferred, since the etching is unidirectionally oriented and therefore only material oriented along a horizontal surface at which the focused ions can impinge, i.e., the bottom surface 24 as well as the to poxide layer 12, will be removed. Removal of a portion of the first oxide layer 12 will occur during this etching step, however, the amount of material removed is negligible compared to the total thickness of this oxide layer 12.

Figure 6:
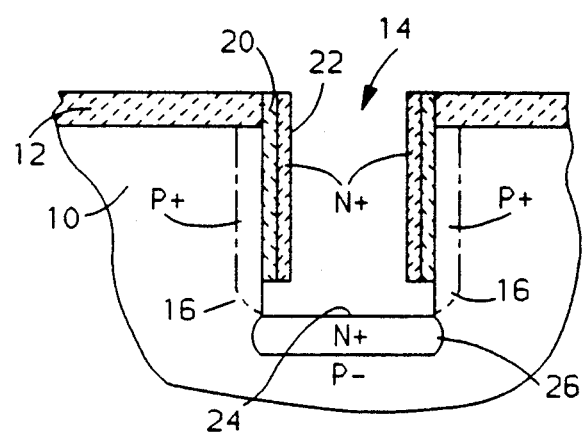

Next, as shown in FIG. 6, a buried layer 26 of appropriate electrical conductivity is formed at the bottom surface 24 of the trench 14 within the silicon substrate 10. In the preferred embodiment, the buried layer 26 is doped to be of N+ type conductivity at a dopant level of about $10^{18}$ atoms/cm$^3$, again using phosphorous, arsenic or antimony as the dopant within an appropriate gaseous source or alternatively ion implantation techniques. Although this buried layer 26 need not be formed for purposes of achieving the dielectric isolation method of this invention, it is preferred since it is a common practice to include a buried layer 26 within an integrated circuit and since it demonstrates the additional usefulness of this invention.

Figure 7:
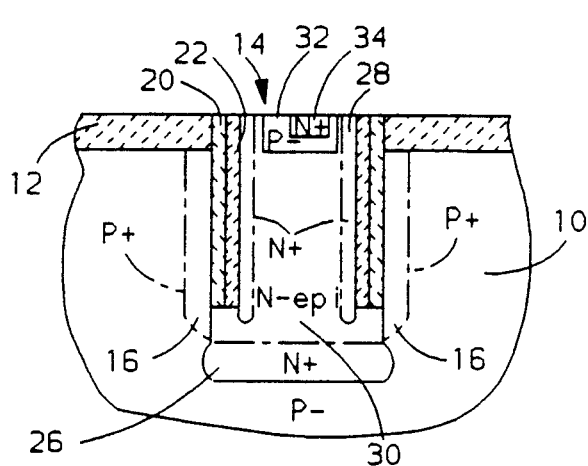

Next, as shown in FIG. 7, selective epitaxial silicon 30 was grown from the exposed underlying silicon substrate 10 at the bottom surface 24 of the trench 14. In the preferred embodiment, the epitaxial silicon 30 is grown from the N+ buried layer 26, and is also characterized by N-type conductivity, so that a bipolar junction is not formed at the interface of the buried layer 26 and epitaxial silicon 30. The gaseous mixture used to deposit the epitaxial silicon 30 is doped appropriately with the phosphorus, antimony or arsenic, as described above in accordance with conventional techniques, so as to result in N-type conductivity epitaxial silicon, regardless of whether the N+ buried layer 26 is present or not. The epitaxial silicon 30 was deposited using conventional techniques that included the use of an "AMT 7800" Epitaxial Reactor at a temperature of about 1180° C. In order to effect the diffusion of the dopant from the doped oxide sidewalls 22 into the epitaxial silicon 30, as discussed more fully later, the temperature of this epitaxial silicon deposition step must be at least about 850° C. The gaseous mixture utilized was a standard mixture of dichlorosilane and hydrogen known within the art. The epitaxial silicon 30 was grown until it was essentially level with the first oxide layer 12.

During deposition of the epitaxial silicon 30, dopants within the N+ doped oxide sidewalls 22 concurrently diffuse into the adjacent epitaxial silicon 30. Therefore, a heavily doped region 28 of N+epitaxial silicon is formed adjacent with the entire length of the oxide sidewall 22 to the buried layer 26. This heavily doped region 28 of N+ epitaxial silicon is characterized by a dopant level of about $5 \times 10^{18}$ atoms/cm$^3$, and is dependent upon the dopant level of the doped silicon oxide sidewalls 22. The dopant level of this region may vary between about $10^{17}$ atoms/cm$^3$ and about $10^{21}$ atoms/cm$^3$ with suitable results expected. What is critical to the invention is the formation of a heavily doped, low resistivity, highly conductive region within the epitaxial silicon 28 by diffusion from the doped silicon oxide sidewalls. This heavily doped, low resistivity path 28, or contact, is provided along the length of the sidewalls 22 to the buried layer 26. This contact 28 to the buried layer 26 is also referred to as a deep plug.

The N+ doped, silicon oxide sidewalls 22 of this invention enable the formation of this electrical contact 28 to the buried layer 26 without the shortcomings of the prior art. Since the doped oxide sidewall 22 is formed prior to the growth of the epitaxial silicon 30 within the trench 14, the dopants from the oxide sidewall 22 concurrently diffuse into the adjacent epitaxial silicon 28 during deposition. The contact 28 to the buried layer 26 is thereby formed without the previous requirement for diffusion of dopants through the entire thickness of the epitaxial silicon layer to the buried layer 28.

Lastly, as also illustrated in FIG. 7, conventional processing techniques may be used to form traditional device components 32 and 34 within the top region of the epitaxial silicon 30. An NPN transistor is depicted in FIG. 7.

It is to be noted that generally in conventional selective epitaxial silicon films, a varying degree of defects are observed at the interface between the silicon oxide and the epitaxial silicon. These interface defects are problematic in that they are generally located in a reverse bias depletion region and therefore become electrically active, to the detriment of the device performance. The method of this invention overcomes this drawback associated with these interface defects. Looking again at FIG. 7, the high dopant concentration from the doped oxide sidewall 22 diffuses substantially into the epitaxial silicon 28 so as to sufficiently travel past the interface between the two materials and thereby avoid the interface defects. As schematically represented in FIG. 7, the highly doped, diffusion zone of the epitaxial silicon 28 is approximately as wide as the original doped silicon oxide sidewall 22. Therefore the interface defects will no longer be of concern since they are no longer within a depletion region due to the high doping level within the sidewall portion 28 of the epitaxial silicon 30. This causes the edge defects to be electrically inactive. This electrical inactivity will allow selective epitaxial growth techniques to be used more readily, even when some defects are present.

Figure 8:
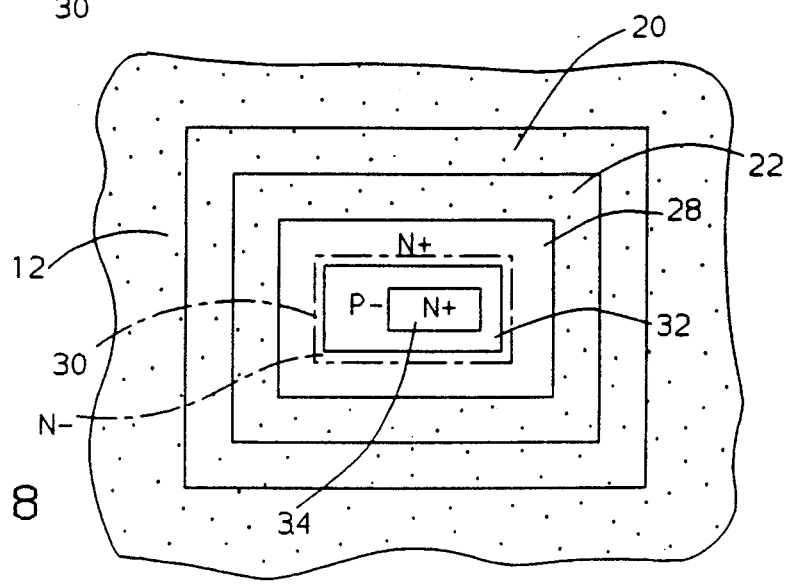
FIG. 8 is a top view of a semiconductor integrated circuit device formed using the method of this invention.

FIG. 8 is a schematic illustration of a top view of an NPN bipolar transistor fabricated with the method of this invention, which may be useful for such applications as high speed or high power. FIG. 8 corresponds to the device of FIG. 7. As is common with such devices, the highly conductive, deep N+ epitaxial silicon plug 28 (or contact), which contacts the buried layer, circles the P-type epitaxial silicon base 32 formed in the top layer of the epitaxial silicon 30, with this invention both the dielectric isolation and the highly conductive deep N+ epitaxial silicon plug 28 were formed during the selective epitaxial growth step when the dopants from the surrounding heavily doped, oxide layer 22 concurrently diffused into the epitaxial silicon 28 as it was being deposited.

The width of the highly doped diffusion zone containing the electrically conductive, deep N+ plug 28 after epitaxial growth was about 1.6 micrometers, as determined by measuring electrical resistance and finding the junction between the epitaxial silicon 30 and this N+ plug 28. It is believed that electrically conductive plugs could be formed with even narrower dimensions, even submicron dimensions, by optimizing the teachings of this invention. The depth of this highly conductive, deep N+ plug 28 is determined by the depth of the original silicon trench 14 (or alternatively the thickness of oxide layer 12). The electrical sheet resistivity of this highly conductive, deep N+ plug 28 was determined to be about 124 ohms/square. The concentration of dopant within this N+ plug 28, as measured at the top surface, is approximately three to four orders of magnitude higher than the N-type epitaxial silicon material 30; $5 \times 10^{18}$ atoms/cm$^3$ for the highly doped, deep N+ plug 28 versus $1.5 \times 10^{15}$ atoms/cm$^3$ for the epitaxial silicon 30.

Even after the formation of the P-type base 32 and N+ emitter 34, using conventional techniques at a temperature of about 900° C. for about 45 minutes, the width of the highly doped diffusion zone within the epitaxial silicon corresponding to the width of the deep N+ plug 28 to the buried layer was about 1.65 micrometers which was about 0.05 micrometers wider than after the epitaxial silicon deposition step. Therefore, it is clear that the width of this highly doped diffusion zone 28 is not significantly affected by the relatively low temperature processes used to form the base 32 and emitter 34 after the epitaxial silicon 30 is deposited, but rather the diffusion of phosphorus from the doped oxide sidewalls 22 into this highly doped diffusion zone 28 is clearly dominated by the higher temperature epitaxial silicon deposition step.

It is also clear that the method of this invention could be used with other isolation technologies, such as V-groove techniques wherein a V-groove is formed within the silicon substrate instead of the trench as described above. With the V-groove technology, an oxide layer would be formed on the sidewalls of the V-groove and this oxide layer would be similarly doped as described above. During subsequent growth of the epitaxial silicon, the dopant within the silicon oxide would accordingly diffuse into the epitaxial silicon, forming a highly doped, electrically conductive N+ diffusion region of epitaxial silicon adjacent to the oxide layer on the V-groove.

In addition, the teachings of this invention could easily be applied to the use of an N-type substrate, or alternatively other dopants could be used so as to result in different electrical conductivities depending upon the particular application and desired outcome.

The method of this invention, wherein an integrated circuit is dielectrically isolated by means of first surrounding the semiconductor device with doped silicon oxide sidewalls which diffuse into and heavily dope the subsequently grown, adjacent epitaxial silicon, is particularly advantageous and inventive as compared to the conventional techniques for accomplishing such isolation. Because the epitaxial silicon is doped to be of an opposite conductivity type as the surrounding substrate, this prevents the formation of parasitic charge-depleting effects along the sidewalls during use of the integrated circuit.

Also, since the sidewalls are doped prior to the growth of the epitaxial silicon within the sidewalls, the dopant within the sidewalls diffuses into an adjacent region of the epitaxial silicon, thereby forming a low resistivity path or contact to a buried layer within the integrated circuit. Since long diffusion periods are not required to form this buried layer contact, extremely small geometry devices can be made. It is believed that submicron wide contacts to the buried layer may be formed. Also, any defects which may exist at the interface between the silicon oxide and epitaxial silicon become electrically inactive because the diffusion zone within the epitaxial silicon is sufficiently wide so as to avoid these defects.

Therefore, while our invention has been described in terms of a preferred embodiment, it is apparent that other forms could be readily adopted by one skilled in the art, such as by modifying the processing parameters such as by using a patterned silicon oxide layer instead of the silicon trench, or by modifying the materials like starting with an N-type substrate or by varying the dopants and concentrations. Accordingly, the scope of the invention is to be limited only by the following claims.

The embodiments of the invention in which an exclusive property or privilege is claimed are defined as follows:

1. A method for dielectrically isolating an integrated circuit comprising the following steps:
   providing a silicon substrate having a surface oriented along a single crystallographic plane and characterized by a first electrical conductivity type;
   depositing a first layer of silicon oxide onto said surface of said substrate;

patterning said first layer of oxide so as to expose at least one region of said underlying substrate;

etching said at least one exposed region of said silicon substrate so as to form a corresponding number of trenches within said silicon substrate, the integrated circuit being subsequently formed within said trench;

depositing a second layer of silicon oxide on the sidewalls and bottom surface of said trench, said second layer of silicon oxide comprising an appropriate dopant so as to be characterized by an opposite electrical conductivity type as said silicon substrate;

etching said second layer of silicon oxide from said bottom surface of said trench so as to again expose said underlying silicon substrate, wherein the portions of said second layer of silicon oxide deposited on said sidewalls of said trench remain; and epitaxially growing silicon from said exposed underlying silicon within said trench at a temperature sufficient to effect substantial diffusion of said dopant within said second silicon oxide layer on said sidewalls into an adjacent diffusion region of said epitaxial silicon, said diffusion region of epitaxial silicon being characterized by an electrical conductivity type opposite to said substrate;

wherein the method is effective to dielectrically isolate the integrated circuit formed within said epitaxial silicon.

2. A method for dielectrically isolating an integrated circuit as recited in claim 1 wherein said silicon substrate is oriented along the [100] crystallographic plane.

3. A method for dielectrically isolating an integrated circuit as recited in claim 1 wherein said silicon substrate is oriented along the [111] crystallographic plane.

4. A method for dielectrically isolating an integrated circuit as recited in claim 1 wherein said silicon substrate is doped to be a P-type electrical conductivity.

5. A method for dielectrically isolating an integrated circuit as recited in claim 1 wherein said about 850° C.

6. A method for dielectrically isolating an integrated circuit as recited in claim 1 wherein said diffusion region of epitaxial silicon is characterized by a dopant level of between about $10^{17}$ atoms/cm$^3$ and about $10^{21}$ atoms/cm$^3$.

7. A method for dielectrically isolating an integrated circuit as recited in claim 1 further comprising prior to said epitaxially growing step an ion implantation step for forming a buried layer within said substrate at said bottom surface of said trench, said buried layer being characterized by an opposite electrical conductivity type as compared to said substrate.

8. A method for dielectrically isolating an integrated circuit while providing an electrical contact to an electrically conductive buried layer within the integrated circuit comprising the following steps:

providing a silicon substrate having a surface oriented along a single crystallographic plane and characterized by a P-type electrical conductivity;

depositing a first layer of silicon oxide onto said surface of said substrate;

patterning said first layer of silicon oxide so as to expose at least one region of said underlying substrate;

etching said at least one exposed region of said silicon substrate so as to form a corresponding number of trenches within said silicon substrate, the integrated circuit being subsequently formed within said trench;

depositing a second layer of silicon oxide on the sidewalls and bottom surface of said trench, said second layer of silicon oxide comprising an appropriate dopant so as to be characterized by an N-type electrical conductivity;

etching said second layer of silicon oxide from said bottom surface of said trench so as to again expose said underlying silicon substrate, wherein the portions of said second layer of silicon oxide deposited on said sidewalls of said trench remains;

forming an electrically conductive buried layer within said substrate at said bottom surface of said trench, said buried layer being characterized by an N-type electrical conductivity; and epitaxially growing silicon from said exposed underlying silicon at said buried layer at a temperature greater than about 850° C. which is sufficient to effect substantial diffusion of said dopant within said second silicon oxide layer on said sidewalls into an adjacent diffusion region of said epitaxial silicon, said diffusion region of epitaxial silicon being characterized by an electrical conductivity type opposite to said substrate;

wherein the method is effective to dielectrically isolate the integrated circuit formed within said epitaxial silicon and concurrently contact said electrically conductive buried layer with a low resistivity, electrical contact at said diffusion region of epitaxial silicon.

9. A method for dielectrically isolating an integrated circuit while providing an electrical contact to a buried layer within the integrated circuit, as recited in claim 8, wherein said silicon substrate is oriented along the [100] crystallographic plane.

10. A method for dielectrically isolating an integrated circuit while providing an electrical contact to a buried layer within the integrated circuit, as recited in claim 8, wherein said silicon substrate is oriented along the [111] crystallographic plane.

11. A method for dielectrically isolating an integrated circuit while providing an electrical contact to a buried layer within the integrated circuit, as recited in claim 8, wherein the portions of said silicon oxide layers removed are removed using reactive ion etching techniques.

12. A method for dielectrically isolating an integrated circuit as recited in claim 8 wherein said diffusion region of epitaxial silicon is characterized by a dopant level of between about $10^{17}$ atoms/cm$^3$ and about $10^{21}$ atoms/cm$^3$.

13. A method for dielectrically isolating an integrated circuit while providing an electrical contact to a buried layer within the integrated circuit, comprising the following steps:

providing a silicon substrate having a surface oriented along a single crystallographic plane and characterized by a P-type electrical conductivity;

depositing a first layer of silicon oxide onto said surface of said substrate;

patterning a region of said first layer of silicon oxide so as to expose said underlying silicon substrate, the integrated circuit being subsequently formed within said exposed region;

depositing a second layer of silicon oxide on the sidewalls and bottom surface of said patterned region of said first layer of silicon oxide, said second layer of silicon oxide comprising an appropriate dopant so as to be characterized by an N-type electrical conductivity;

etching said second layer of silicon oxide from said bottom surface so as to again expose said underlying silicon substrate, wherein the portions of said second layer of silicon oxide deposited on said sidewalls remains;

forming a buried layer within said substrate at said bottom surface, said buried layer being characterized by an N-type electrical conductivity; and epitaxially growing silicon from said exposed underlying silicon at said buried layer at a temperature greater than about 850° C. which is sufficient to effect substantial diffusion of said dopant within said second oxide layer on said sidewalls into an adjacent diffusion region of said epitaxial silicon, said diffusion region of epitaxial silicon being characterized by an electrical conductivity type opposite to said substrate;

wherein the method is effective to dielectrically isolate the integrated circuit formed within said epitaxial silicon and concurrently contact said buried layer with a low resistivity, electrical contact at said diffusion region of epitaxial silicon.

14. A method for dielectrically isolating an integrated circuit while providing an electrical contact to a buried layer within the integrated circuit, as recited in claim 13 wherein said silicon substrate is oriented along the [100] crystallographic plane.

15. A method for dielectrically isolating an integrated circuit while providing an electrical contact to buried layer within the integrated circuit, as recited in claim 13 wherein said silicon substrate is oriented along the [111] crystallographic plane.

16. A method for dielectrically isolating an integrated circuit while providing an electrical contact to a buried layer within the integrated circuit, as recited in claim 13 wherein the portions of said silicon oxide layers removed are removed using reactive ion etching techniques.

17. A method for dielectrically isolating an integrated circuit as recited in claim 13 wherein said diffusion region of epitaxial silicon is characterized by a dopant level of between about $10^{17}$ atoms/cm$^3$ and about $10^{21}$ atoms/cm$^3$.

* * * * *